(12) United States Patent
Sekiguchi

(10) Patent No.: US 6,195,188 B1
(45) Date of Patent: Feb. 27, 2001

(54) OPTICAL WAVELENGTH CONVERSION APPARATUS AND METHOD

(75) Inventor: Yoshinobu Sekiguchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/083,386

(22) Filed: May 22, 1998

(30) Foreign Application Priority Data

May 28, 1997 (JP) .................................................. 9-154476

(51) Int. Cl.[7] .................................................. H04J 14/02
(52) U.S. Cl. .................. 359/124; 359/122; 359/156; 359/326; 372/27; 372/96
(58) Field of Search .................. 359/326, 122, 359/156, 124; 372/27, 96

(56) References Cited

U.S. PATENT DOCUMENTS 6,075,799 * 6/2000 Uchida et al. .......................... 372/27
6,091,745 * 7/2000 Nitta ....................... 372/27

FOREIGN PATENT DOCUMENTS 6-120595 4/1994 (JP) .

OTHER PUBLICATIONS

Kondo, K., et al., "Giga–bit Operation of Wavelength Conversion Laser," 1990 International Topical Meeting on Photonic Switching, 13D–9, pp. 199–201 (1990).

* cited by examiner

Primary Examiner—Kinfe-Michael Negash
(74) Attorney, Agent, or Firm—Fitzpatrick, Cella, Harper & Scinto

(57) ABSTRACT

An optical wavelength conversion apparatus includes a polarization switchable semiconductor laser whose oscillation polarization mode is switchable between two independent polarization modes (typically, TE and TM modes) of different wavelengths, depending on its stimulated condition, a first unit for selecting a polarization mode for light input to the semiconductor laser from among the two independent polarization modes, and a second unit for selecting a polarization mode for light emitted from the semiconductor laser from among the two independent polarization modes. As a result, a wavelength of the light of the polarization mode selected by the first unit is converted into another wavelength of the light of the polarization mode selected by the second unit.

28 Claims, 10 Drawing Sheets

OPTICAL WAVELENGTH CONVERSION APPARATUS AND METHOD

BACKGROUND OF THE INVENTION

1. Field of the Invention

The present invention relates to an optical wavelength division multiplex communication network in the technical field of optical communications and an optical wavelength conversion apparatus and a method usable in optical wavelength division multiplex communications and so forth, and particularly, to an optical wavelength conversion apparatus and a method for directly converting a wavelength of an optical signal into another as the optical signal is maintained.

2. Related Background Art

Conventionally, in a distributed Bragg reflector (DBR) type semiconductor with separate multi-electrodes, there has been proposed an optical wavelength conversion apparatus in which part of its active layer is used as a saturable absorber region (see Kondo et al., "Giga-bit Operation of Wavelength Conversion Laser", 1990 International Topical Meeting on Photonic Switching, 13D-9, 1990). FIG. 1A shows the structure of that optical wavelength conversion apparatus. In FIG. 1A, reference numeral 521 designates a first active region, reference numeral 522 designates a saturable absorber region, reference numeral 523 designates a second active region, reference numeral 524 designates a phase adjusting region and reference numeral 525 designates a DBR region.

FIG. 1B shows the operation of the optical wavelength conversion apparatus in FIG. 1A. Its horizontal and vertical axes respectively indicate an injection current into the second active region 523 and the intensity of output light. It is seen therefrom that the current in its oscillation state obtained by increasing the injection current is larger than the current in its non-oscillation state obtained by decreasing the injection current from the oscillation state. As illustrated in FIG. 1B, when the injection current is set at a bias point A, no output light is emitted when no input light is input into the apparatus. When the input light is input into the apparatus, the light absorption coefficient of the saturable absorber region 522 is reduced and the laser hence reaches the oscillation state, emitting the output light. A wavelength of the output light can be varied by controlling currents injected into the phase adjusting region 524 and the DBR region 525, so that the wavelength of the input light can be converted into a desired wavelength of the output.

In that optical wavelength conversion apparatus, since the required time within which the saturable absorber region 522 returns to its initial state after the wavelength conversion operation is dominated by the carrier injection time, the modulation speed of an optical signal for the wavelength conversion operation is normally limited to the order of nanoseconds and high-speed operation is thus impossible.

In order to solve the above problem, there has also been proposed another optical wavelength conversion apparatus which uses the oscillation of light in two mutually-perpendicular polarization modes in a semiconductor laser to convert the wavelength (see Japanese Patent Application Laid-open No. 6(1994)-120595). FIG. 2 illustrates the structure of this optical wavelength conversion apparatus. In FIG. 2, a predetermined polarization mode (which corresponds to one polarization mode of light emitted from a semiconductor laser 601) of input light 612 is selected by a polarization beam splitter device 608, and the selected one is input into the semiconductor laser 601 through a lens 609. The semiconductor laser 601 forms an external resonator cavity between its input facet and a mirror 652 and attains the laser oscillation at a desired wavelength with the selected polarization mode (this desired wavelength is picked up by a wavelength filter 662 with a voltage terminal 672 for controlling the wavelength). In contrast thereto, where the input light 612 does not contain the desired wavelength, the external cavity is formed between the input facet of the semiconductor laser 601 and another mirror 651, and the laser oscillation occurs in the other polarization mode and at a given wavelength selected by a wavelength tunable filter 661.

As discussed above, output light 613 can be obtained when the input light 612 does not contain the desired wavelength. Here, since the oscillation wavelength can be controlled by the wavelength tunable filter 661, as a result, the wavelength of the input light 612 can be converted into the desired wavelength of the output light 613. Though the signals of the input light 612 and the output light 613 are in an inverted relationship with each other, the output light 613 can be readily returned to an original signal of the input light 612. Further, in FIG. 2, reference numeral 602 designates an anti-reflection coating provided on one output facet of the semiconductor laser 601, reference numeral 603 designates an electrode for a current supply, reference numeral 604 designates a polarization beam splitter device for separating two mutually-perpendicular polarization modes emitted from the semiconductor laser 601, reference numeral 610 designates a lens for guiding the light emitted from the semiconductor laser 601 to the polarization beam splitter device 604, and reference numeral 611 designates an output lens for receiving output light 613 from mirror 651.

In that optical wavelength conversion apparatus, however, wavelength tunable filters for each polarization mode are needed, as well as mirrors for constructing the respective external cavities. The large number of optical elements makes the structure complicated.

SUMMARY OF THE INVENTION

A first object of the present invention is therefore to provide an optical wavelength conversion apparatus in which high-speed operation is possible, the number of elements is small and the structure is simple. Another object of the invention is to provide an optical wavelength conversion method and a system using the optical wavelength conversion apparatus.

Another object of the present invention is to provide an optical wavelength conversion apparatus with a wide operation wavelength band which can perform wavelength conversion even when its input light receives insufficient gain from its semiconductor laser.

The present invention is generally directed to an optical wavelength conversion apparatus including a polarization switchable semiconductor laser whose oscillation polarization mode is switchable between two independent polarization modes of different wavelengths, a first mode selecting or control portion for selecting or producing light in the same polarization mode as one of the switchable polarization modes for inputting of the selected or produced light to the semiconductor laser, and a second mode selecting or control portion for selecting or producing light in the other polarization mode from light emitted from the semiconductor laser.

Specifically, the semiconductor laser may be a semiconductor laser which includes a periodical structure therein and an active layer with a nearly equal gain for the two independent polarization modes (such as a multi-electrode distributed feedback (DFB) semiconductor laser and a multi-electrode distributed Bragg reflector (DBR) semiconductor laser), and at least one of the first and second mode selecting or control portions may be a polarizer, a polarization maintaining fiber or the like. Further, the multi-electrode distributed feedback semiconductor laser may include a phase shift region.

In the above structure, when an injection current overs its threshold, the laser oscillates with one of the two polarization modes. Here, the oscillation polarization mode is determined by nonuniformity of the injection current, a slight difference between gains for the two polarization modes, polarization dependencies of the periodic structure or diffraction grating and the waveguide and so forth. The other polarization mode oscillation is suppressed and would not normally occur. However, if the input light has the same polarization as the suppressed mode, the wavelength near that at a gain peak of the active layer, and sufficient intensity, the laser oscillation switches to the input light polarization mode. Further, if the gains for the two polarization modes are adjusted such that when the input light is stopped, the oscillation polarization mode is returned to the previous polarization mode, the polarization mode of the output light can be switched between the mutually-perpendicular polarization modes depending on whether the input light is switched on or off. Since the change in the number of carriers during the polarization switching operation is small, the laser can operate fast. Here, the condition of the nearly equal gain for the two independent polarization modes shows a condition in which a gain difference between respective oscillation wavelengths in the two polarization modes is preferably within 10 dB and more desirably within 3 dB.

The emitted light can be obtained irrespective of whether the input light is on or off, but only the light output corresponding to the off condition of the input light can be easily taken since the polarization mode differs between those different outputs. The wavelength of the output light can be set at a predetermined wavelength by controlling the injection current into the diffraction grating region in the semiconductor laser or the like, so that the wavelength of the input light can be converted into that predetermined wavelength.

During the above operation, the output light is emitted only when the input light is off. Therefore, though the on/off condition of the output light is in an inverted relationship with the on/off condition of the input light, the original signal can be readily regenerated from the output light. For instance, the inversion is dissolved by using an even number of the optical wavelength conversion apparatuses of the present invention.

More specifically, to input amplified light into the semiconductor laser, an amplifying unit or function of the input light may added. Thereby, even when the wavelength of the input light is away from to the gain peak region of the semiconductor laser, wavelength conversion is possible and thus a wide-band optical wavelength conversion apparatus can be obtained.

Generally, since a sufficient gain cannot be obtained when the wavelength of the input light is away from the gain peak wavelength, no laser oscillation occurs in such a case. In the above structure, however, since the input light is amplified and input into the semiconductor laser, the polarization switching can be achieved even when the gain of the semiconductor laser is insufficient at the wavelength of the input light.

As the unit for amplifying the input light, a semiconductor optical amplifier which can amplify the input light as it is, can be effectively used without the conversion between light and electricity. Further, when an amplifier for amplifying only the predetermined polarization mode is used, the electric power used by the amplifier can be reduced.

The semiconductor optical amplifier and the semiconductor laser may be integrated on a common substrate. The output of the optical amplifier and the input of the semiconductor laser can be coupled to each other through the waveguide, so lens parts can be omitted and the size of the optical wavelength conversion apparatus can be made still smaller.

Further, at least one of the facing facets between the semiconductor optical amplifier and the semiconductor laser may be inclined slightly to a direction of the stripe waveguide, so that the lasing light of the semiconductor laser can be prevented from being incident on the semiconductor optical amplifier. Hence the operation can be stably maintained in a preferable state.

Further, the semiconductor laser is switchable between the two oscillation polarization modes by controlling a current injected through at least one of plural electrodes. Hence the oscillation polarization mode of the semiconductor laser can be set to the polarization mode different from the input light mode without the input light, and a practical optical wavelength conversion apparatus can be achieved. The semiconductor laser only needs to be tunable for its oscillation wavelength by controlling a current injected through at least one of plural electrodes, and thus the wavelength after conversion can be set to a desired one.

Further, the semiconductor laser may include an active layer of a multi-quantum well structure, whose nearly equal gain for the two polarization modes is attained by an increase in a TE-mode gain due to its quantum effect and a TM-mode gain due to introduction of a tensile strain into the quantum well layer. The active layer of the semiconductor laser with the nearly equal gain for the two polarization modes may also have a structure in which a compressively-strained quantum well layer with a dominant TE-mode gain and a tensile-strained quantum well layer with a dominant TM-mode gain are layered.

Further, the active layer of the semiconductor laser with the nearly equal gain for the two polarization modes may have a structure in which a first gain region with a gain dominant for one of the polarization modes and a second region with a gain dominant for the other of the polarization modes are arranged in its cavity direction and currents can be independently injected into the first and second gain regions.

Moreover, a wavelength filter for selecting a desired wavelength from input light containing a plurality of multiplexed wavelengths may be arranged, so that the wavelength selected from the multiplexed wavelengths can be converted into a desired wavelength.

An optical wavelength conversion method according to the present invention is characterized in that the above-discussed optical wavelength conversion apparatus is used, light converted to the predetermined polarization mode or produced by selecting a component of the predetermined mode is input to the optical wavelength conversion apparatus, and light with another predetermined polarization mode is taken from the optical wavelength conversion apparatus. Resultantly, the wavelength of the input light (converted to the predetermined polarization mode) is converted into the wavelength of the output light with another predetermined polarization mode.

Further, a wavelength division multiplex communication network according to the present invention includes a transmission line for transmitting an optical signal from a transmitter terminal to a receiver terminal, and the above-discussed optical wavelength conversion apparatus used as an optical wavelength converter which maintains the optical signal. Any wavelength of the multiplexed wavelengths on the transmission line can be thus converted into a desired wavelength as it is, and a wavelength division multiplex communication network, in which wavelengths can be effectively used, no electrical limitation exists, and a large capacity communication can be attained, can be realized.

These advantages and others will be more readily understood in connection with the following detailed description of the preferred embodiments in conjunction with the drawings.

DESCRIPTION OF THE PREFERRED EMBODIMENTS

First Embodiment

Figure 1A:
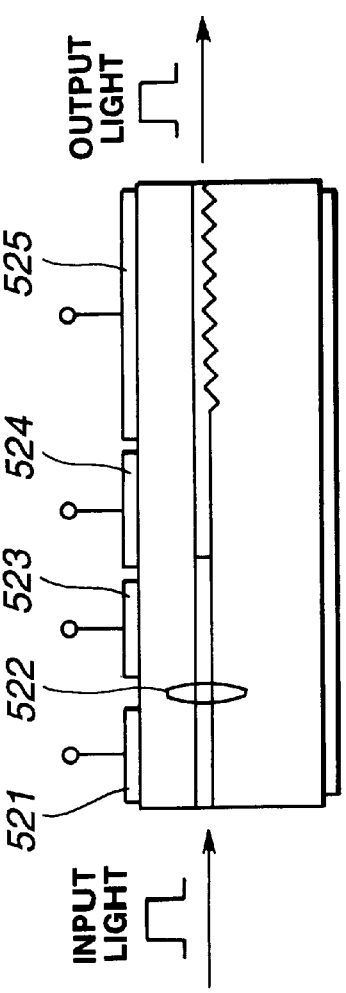
FIG. 1A is a cross-sectional view illustrating the structure of a prior art optical wavelength conversion apparatus.
Figure 1B:
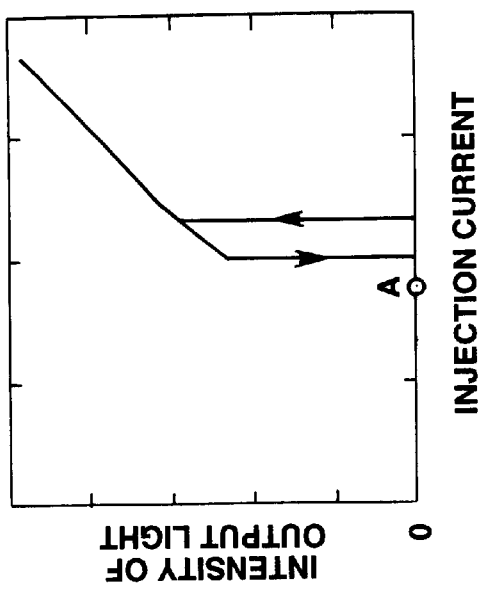
FIG. 1B is a graph illustrating the operation of the prior art optical wavelength conversion apparatus.
Figure 2:
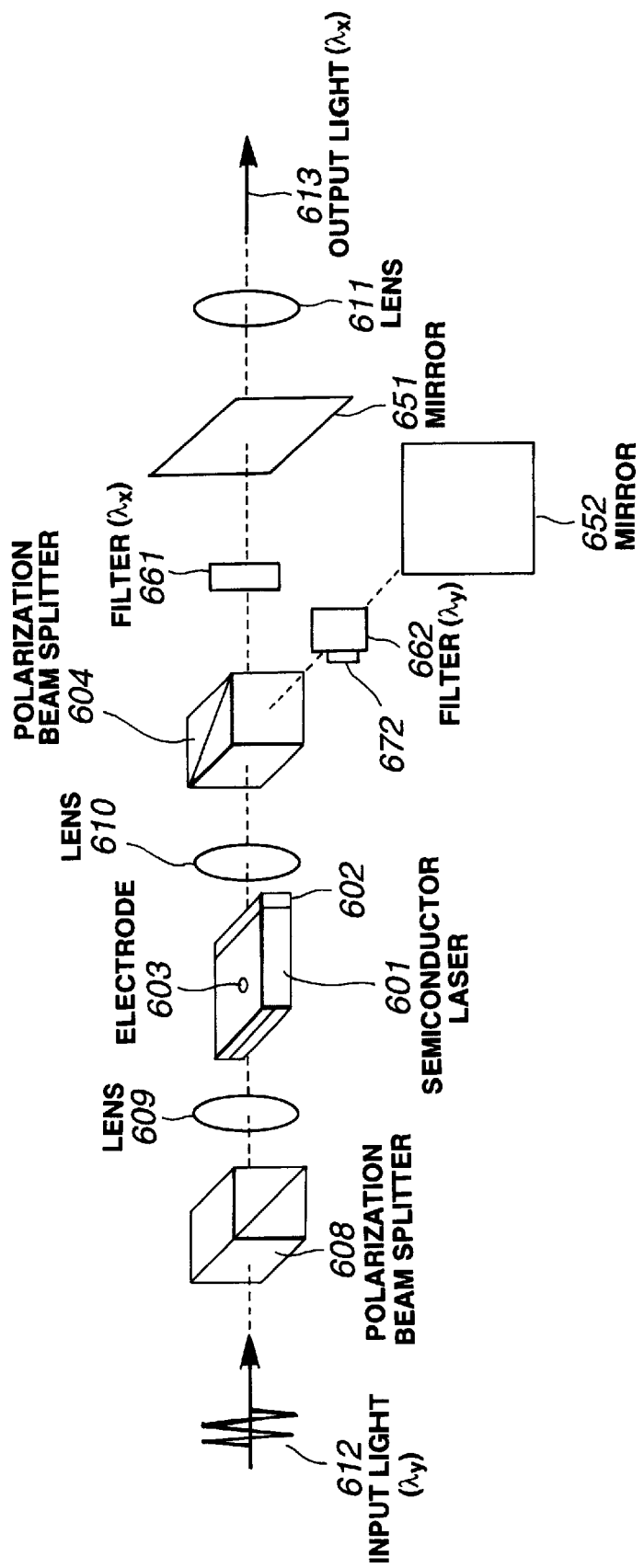
FIG. 2 is a perspective view illustrating the structure of another prior art optical wavelength conversion apparatus.
Figure 3:
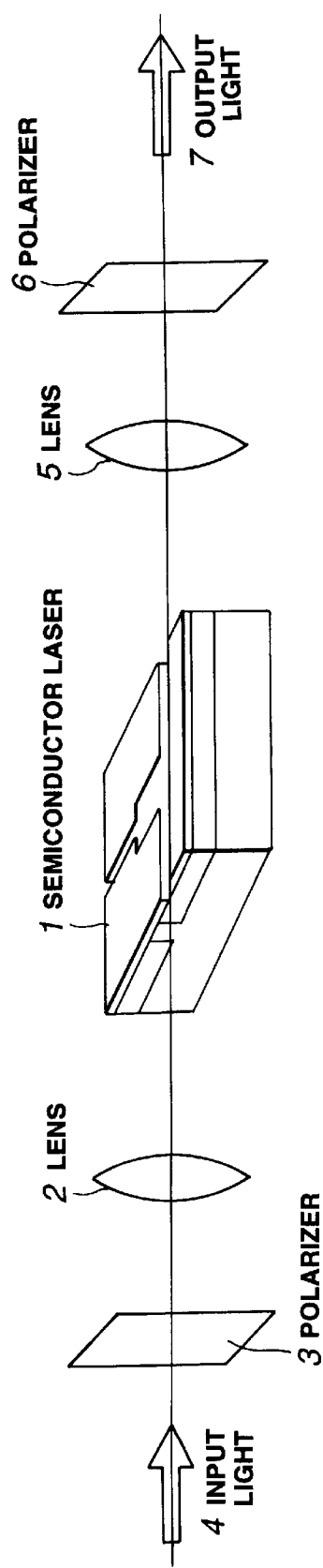
FIG. 3 is a perspective view illustrating the structure of a first embodiment of an optical wavelength conversion apparatus according to the present invention.

A first embodiment will be described with reference to FIGS. 3 and 4. FIG. 3 shows the overall structure of an optical wavelength conversion apparatus of the first embodiment. In FIG. 3, reference numeral 1 designates a three-electrode distributed feedback (DFB) semiconductor laser which has an nearly equal gain for two independent polarization modes (typically, a TE mode and a TM mode). Reference numeral 2 designates a lens for coupling input light 4 to an input facet of semiconductor laser 1. Reference numeral 3 designates a polarization selecting device, or a polarization selecting device, such as a polarizer, for only selecting a desired polarization mode from the input light 4. Reference numeral 5 designates a lens for coupling output light from the semiconductor laser 1 to the outside. Reference numeral 6 designates a polarization selecting device, such as a polarizer, for selecting a desired polarization mode from the output light of the semiconductor laser 1. Reference numeral 7 designates output light produced by the polarization selecting device 6.

In the structure of FIG. 3, two independent polarization modes have a nearly equal gain when current above the threshold is injected into the semiconductor laser 1. Here, the laser oscillation occurs in one of the two polarization modes depending on nonuniformity of the injection current, a slight difference in the gain between the two polarization modes, and polarization dependencies of the diffraction grating and the waveguide in the semiconductor laser 1. Under such a condition, when the polarization mode of the input light 4 is changed to a different polarization mode from the oscillation polarization mode of the semiconductor laser 1 by the polarization selecting device 3 and light of the different polarization mode is input into the semiconductor laser 1, the oscillation changes to the polarization mode of the input light 4.

Therefore, in response to the switching on and off the input light 4, the polarization mode of the output light from the semiconductor laser 1 is switched between the polarization mode of the input light 4 (when the input light is on) and the other perpendicular polarization mode (when the input light is off). Accordingly, when the polarization mode different from that of the input light 4 is selected by the polarization selecting device 6 as the output light 7, the following wavelength conversion can be effected. The signal of the output light 7 is an inverted signal of the input light 4, but the original signal of the input light 4 can be readily regenerated.

A wavelength difference between the TE-mode light and the TM-mode light in the band of 1.55 $\mu$m is about 4 nm, though this difference varies depending on the structure around the active layer in the semiconductor laser 1. Hence, if the wavelength of the input light 4 is equal to the oscillation wavelength of the semiconductor laser 1 in the same polarization mode as that of the input light 4, the wavelength of the input light 4 can be converted into a wavelength about 4 nm away therefrom. Further, since the semiconductor laser 1 is constructed such that its oscillation wavelength can be changed in its wavelength changeable range by controlling the injection currents through the three electrodes of the semiconductor laser 1, the output light 4 at a desired wavelength in the wavelength changeable range can be obtained.

Figure 4:
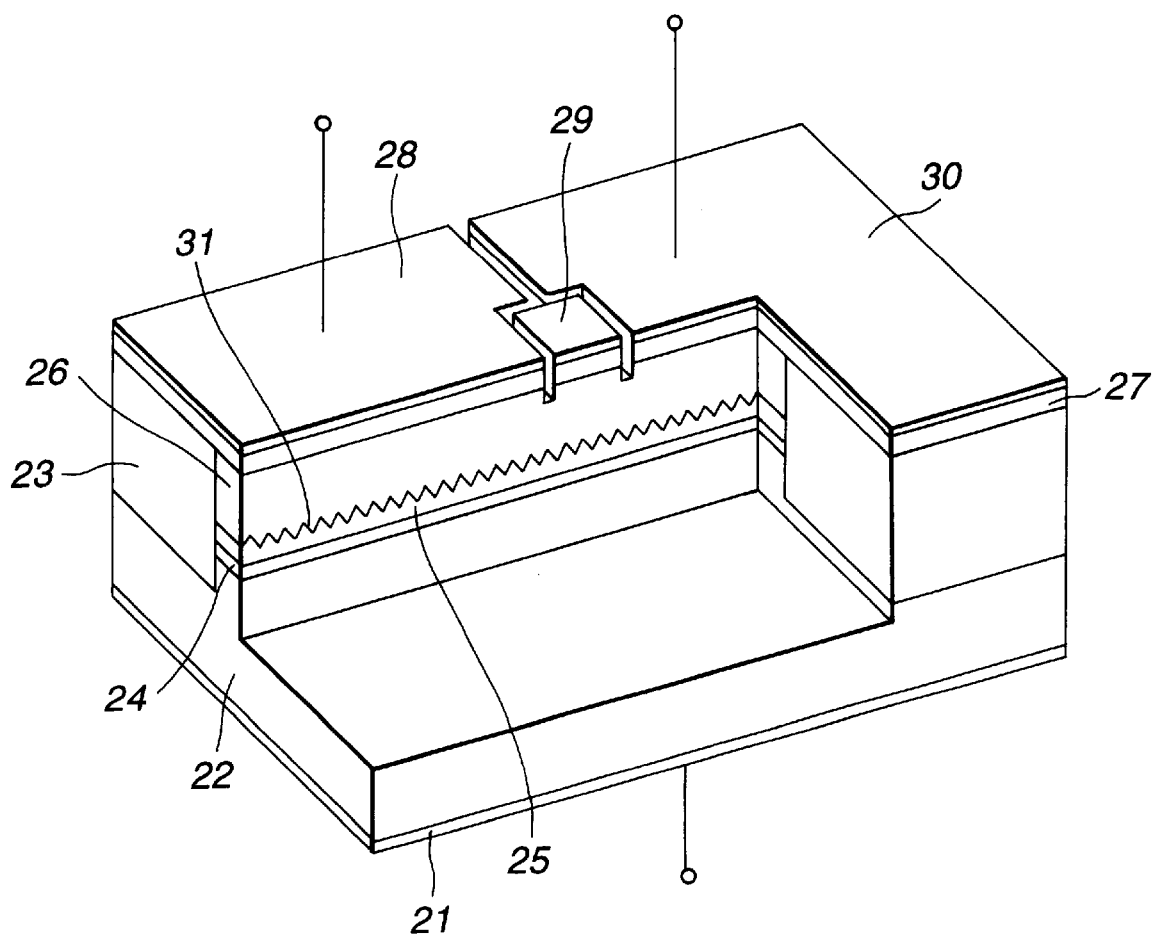
FIG. 4 is a partial cut-away perspective view illustrating the structure of a three-electrode wavelength tunable DFB laser to be used in the first embodiment and the present invention.

FIG. 4 illustrates a three-electrode wavelength tunable DFB laser used in the first embodiment, which has a nearly equal gain for two independent polarization modes (i.e., the TE mode and the TM mode).

In FIG. 4, reference numeral 21 designates a lower common electrode. Reference numeral 22 designates an n-InP substrate and an n-InP lower light confinement layer. Reference numeral 23 designates a high-resistance InP burying layer. Reference numeral 24 designates a multi-quantum well active layer having a nearly equal gain for the two independent polarization modes. A well layer of the active layer 24 is an InGaAs layer whose band edge wavelength and thickness are preferably about 1.55 $\mu$m and 13 nm, respectively, and into which a tensile strain, preferably of −0.6%, is introduced. A barrier layer of the active layer 24 is an InGaAsP layer whose band gap wavelength and thickness are preferably about 1.3 μm and 10 nm, respectively. The active layer 24 is comprised of three well layers and two barrier layers each interposed between the two well layers.

Further, reference numeral 25 designates a light waveguide layer of InGaAsP whose band edge wavelength is preferably about 1.3 μm. Reference numeral 26 designates a p-InP upper light confinement layer. Reference numeral 27 designates a p-InGaAs contact layer. Reference numerals 28, 29, and 30 respectively designate electrodes which are electrically separated from each other by a separation groove and whose lengths in the cavity direction are preferably about 200 μm, 50 μm and 200 μm, respectively. Reference numeral 31 designates a diffraction grating which is formed at the interface between the light waveguide layer 25 and the upper light confinement layer 26 and whose pitch is about 238 nm. Though not illustrated in FIG. 4, low-reflection films of SiN are formed on opposite end facets of the semiconductor laser, respectively.

The above-discussed semiconductor laser is a polarization switchable laser in which the laser oscillation takes place in one polarization mode when current above its threshold current is uniformly injected through all of the electrodes and the polarization mode is switched to the other polarization mode by controlling the current injected through the central electrode 29. The oscillation wavelength can be changed over the wavelength changeable range by varying the ratio between the injection currents injected through the electrodes 28 and 30.

Second Embodiment

Figure 5:
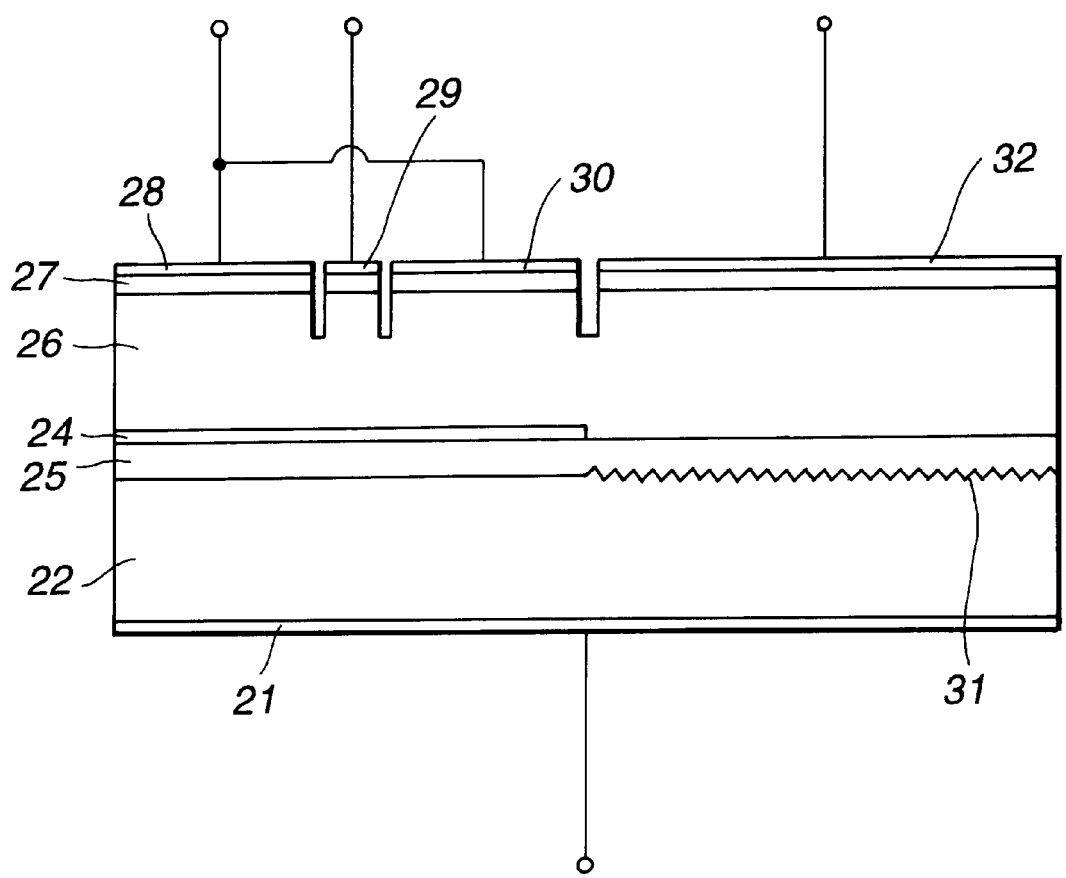
FIG. 5 is a cross-sectional view illustrating the structure of a four-electrode wavelength tunable DBR laser to be used in a second embodiment and the present invention.

A second embodiment will be described with reference to FIG. 5. FIG. 5 shows a cross section of a four-electrode DBR semiconductor laser used in an optical wavelength conversion apparatus of the second embodiment. In FIG. 5, portions having the same structures and the same functions as those of the portions in FIG. 4 are indicated by the same reference numerals. The polarization mode of the laser oscillation is controlled by adjusting injection currents injected through the electrodes 28, 29, and 30, in a manner similar to that of the first embodiment. In contrast, the oscillation wavelength can be adjusted by only controlling a current injected through an electrode 32, so that the wavelength can be readily controlled. The entire structure and operation of the second embodiment are the same as those of the first embodiment.

In this embodiment, a tensile strain of −0.6% is likewise introduced into the multi-quantum well active layer 24, and a nearly equal gain is thus obtained for the two independent polarization modes.

Third Embodiment

Figure 6:
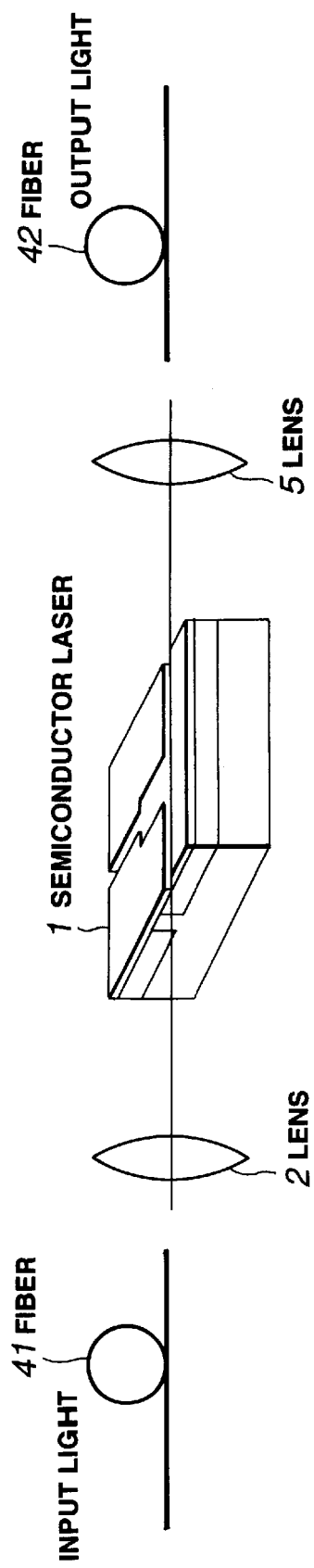
FIG. 6 is a perspective view illustrating the structure of a third embodiment of an optical wavelength conversion apparatus according to the present invention.

FIG. 6 illustrates a third embodiment of the present invention. This embodiment differs from the first embodiment in that polarization maintaining fibers are arranged on both input and output sides such that no polarization control device or polarization selecting device is needed. Input light polarized in one of the two polarization modes of the semiconductor laser travels in a polarization maintaining fiber 41 and enters the semiconductor laser 1 through the lens 2, so the polarization of the light input into the semiconductor laser 1 always takes a predetermined polarization mode. Hence the polarization selecting device 3 used in the first embodiment can be omitted.

In the semiconductor laser 1, the oscillation occurs in the polarization mode different from that of the input light when no input light enters the semiconductor laser 1 (off-state), while the oscillation happens in the polarization mode of the input light when the input light enters the semiconductor laser 1 (on-state), which is similar to the first embodiment. Output light from the semiconductor laser 1 is transmitted through the lens 5 and coupled to a polarization maintaining fiber 42 on the output side, which is set to propagate light in the polarization mode different from that of the input light. As a result, a desired polarization mode can be taken out without using the polarization selecting device on the output side, similarly to the input side. In this embodiment, since there is no demand for the polarization control devices or polarization selecting devices 3 and 6 arranged on the input and output sides in the first embodiment, the structure of the apparatus is simplified and made compact in size. Regarding the other points, this embodiment is the same as the first embodiment.

Fourth Embodiment

Figure 7:
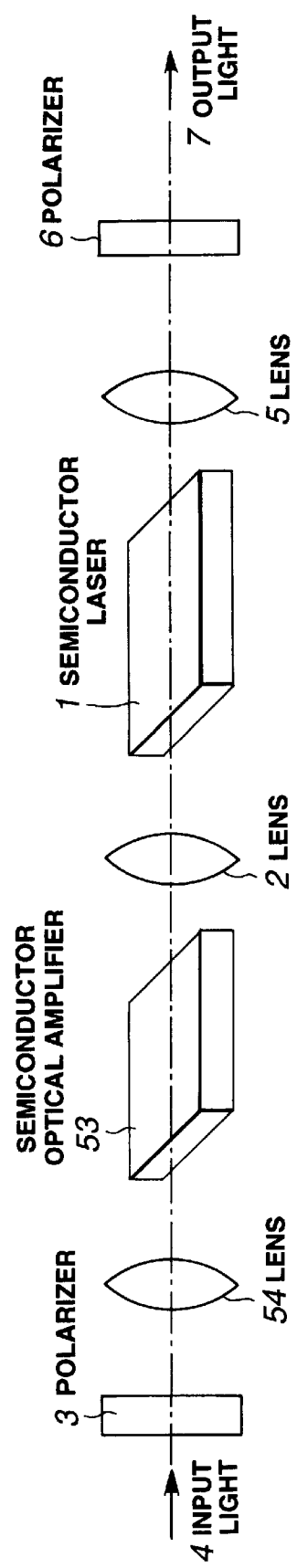
FIG. 7 is a perspective view illustrating the structure of a fourth embodiment of an optical wavelength conversion apparatus according to the present invention.

FIG. 7 illustrates a fourth embodiment of the optical wavelength conversion apparatus of the present invention. This embodiment differs from the first embodiment in that there is arranged an amplifier for amplifying light in a predetermined polarization mode to input the amplified light into the semiconductor laser. In FIG. 7, the same elements as those of the first embodiment are indicated by the same reference numerals. In FIG. 7, reference numeral 53 designates a semiconductor optical amplifier which includes a waveguide with an active layer for directly amplifying the input light as an optical signal (i.e., as it is). Reference numeral 54 designates a lens for coupling the input light 4 to the semiconductor optical amplifier 53 through the polarization control or selecting device 3 (such as a polarizer).

As described in the first embodiment, in the state in which the laser oscillation occurs in one of the two polarization modes in the semiconductor laser 1, when the polarization mode of the input light 4, different from the oscillation mode of the semiconductor laser 1, is selected by the polarization control device or polarization selecting device 3 and the selected light, after amplification by the semiconductor amplifier 53, is input into the semiconductor laser 1, the laser oscillation changes to the polarization mode of the input light.

Since the input light 4 is amplified by the semiconductor optical amplifier 53 and the amplified one is input into the semiconductor laser 1, the oscillation polarization can be switched even when the input light 4 has a wavelength which is away from a gain peak of the semiconductor laser 1 and at which a gain of the semiconductor laser 1 is somewhat decreased. Thus the optical wavelength conversion can be achieved over a wide band range.

In this embodiment, the extending direction of the stripe waveguide in the semiconductor laser 1 is approximately 8° inclined from a direction perpendicular to its facet, so that light of the semiconductor laser 1 is prevented from being incident on the optical amplifier 53. Thus the input light is amplified by the optical amplifier 53 during its single pass therethrough, and its preferable operation can be maintained. This embodiment is the same as the first embodiment in the other respects.

Fifth Embodiment

Figure 8:
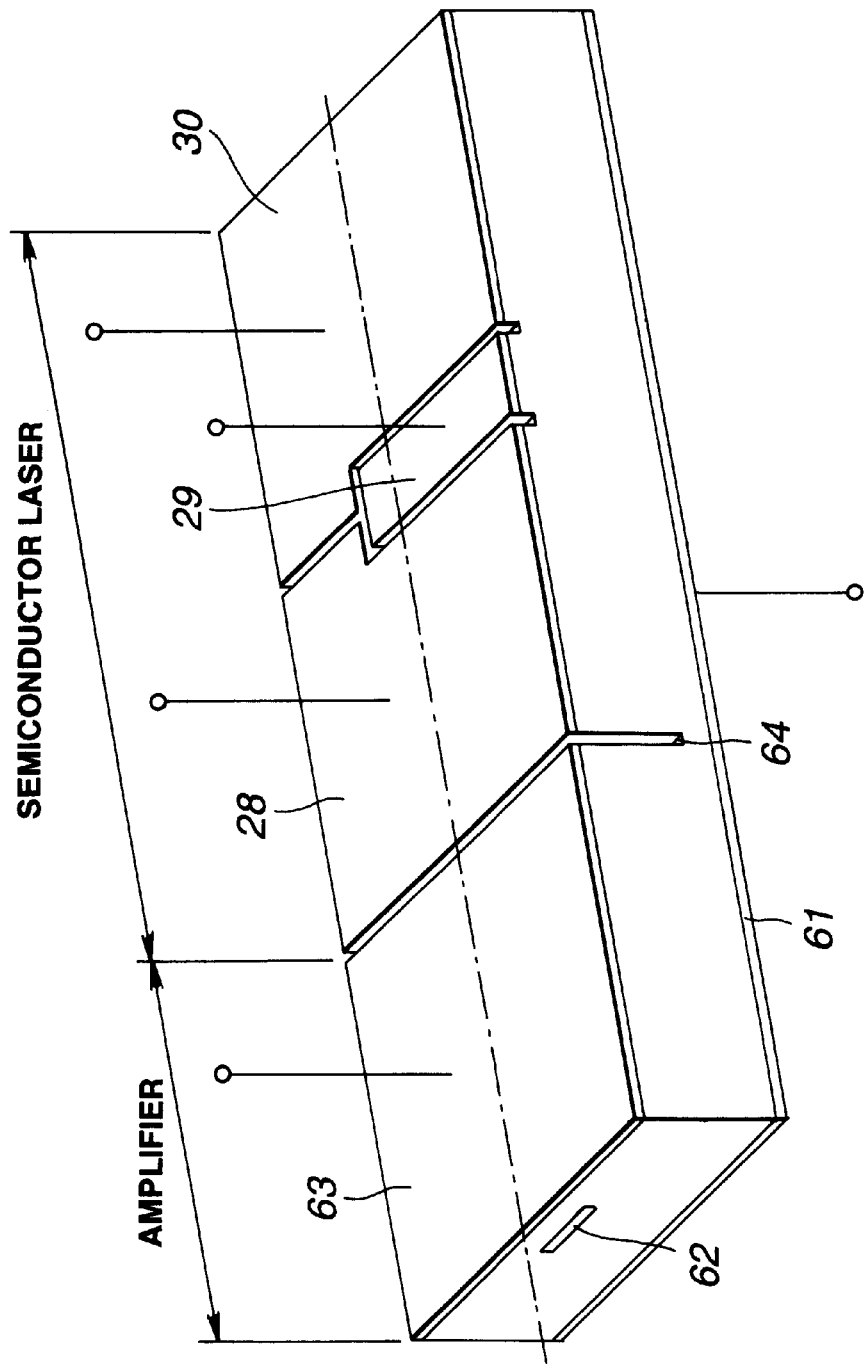
FIG. 8 is a perspective view illustrating the structure of an integrated portion of an optical amplifier and a semiconductor laser to be used in a fifth embodiment of an optical wavelength conversion apparatus according to the present invention.

FIG. 8 illustrates a fifth embodiment of the optical wavelength conversion apparatus of the present invention. In this embodiment, the semiconductor optical amplifier and the semiconductor laser are integrated on a common substrate. The semiconductor laser has the same structure as that of FIG. 4. In a region of the optical amplifier, no diffraction grating is formed near an active layer 62 and a low-reflection coating is formed on its facet on the input side. There is further formed a separation groove 64 extending down to a portion under the active layer 62, which is inclined relative to the cleaved facet by about 8° such that reflection from the groove face and light returning from the semiconductor laser region can be reduced.

In FIG. 8, reference numeral 61 designates a common electrode formed on the substrate side, and reference numeral 63 designates an upper electrode of the amplifier region.

In this embodiment, there is no need of the lens 2 used in FIG. 7, and therefore, fewer components are needed, and the optical adjustment can be facilitated. The fifth embodiment is also the same as the first embodiment in the other respects.

Sixth Embodiment

Figure 9:
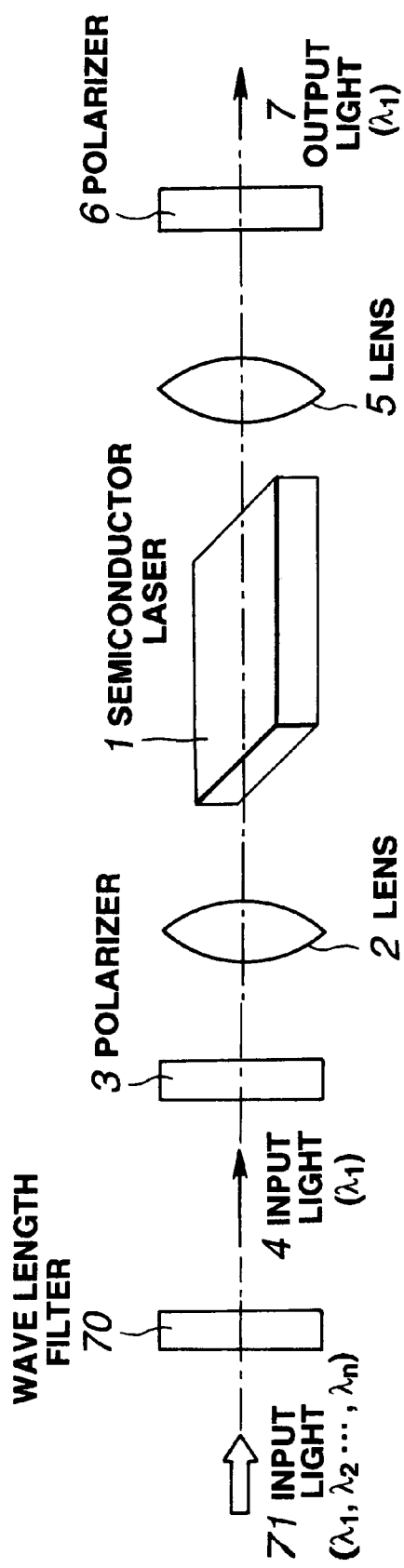
FIG. 9 is a perspective view illustrating the structure of a sixth embodiment of an optical wavelength conversion apparatus according to the present invention.

FIG. 9 illustrates a sixth embodiment of the optical wavelength conversion apparatus of the present invention. This embodiment differs from the fourth embodiment in that a wavelength filter 70 is included which can select the input light 4 at a desired wavelength from wavelength-multiplexed input light 71 containing a plurality of wavelengths. The construction after the selection of the input light 4 and the operation are the same as those of the first embodiment of FIG. 3. According to this embodiment, any one of the multiplexed wavelengths propagated on the transmission line can be converted into a desired wavelength.

Seventh Embodiment

The active layer of the semiconductor laser is not limited to the above-discussed. The active layer may have a structure in which a TM-gain dominant quantum well, into which a tensile strain is introduced, and a TE-gain dominant quantum well, into which a compressive strain is introduced, are layered to obtain a nearly equal gain for the two polarization modes, for example. The nearly equal gain can also be achieved by a structure in which a TM-gain dominant active layer and a TE-gain dominant active layer are serially arranged in the cavity direction and currents are independently injected into those active layers.

Further, in the above embodiments, DFB and DBR semiconductor lasers are described as a polarization switchable semiconductor laser with a periodic structure formed therein, but a vertical cavity surface emitting laser (VCSEL) or the like is likewise applicable.

Eighth Embodiment

Figure 10:
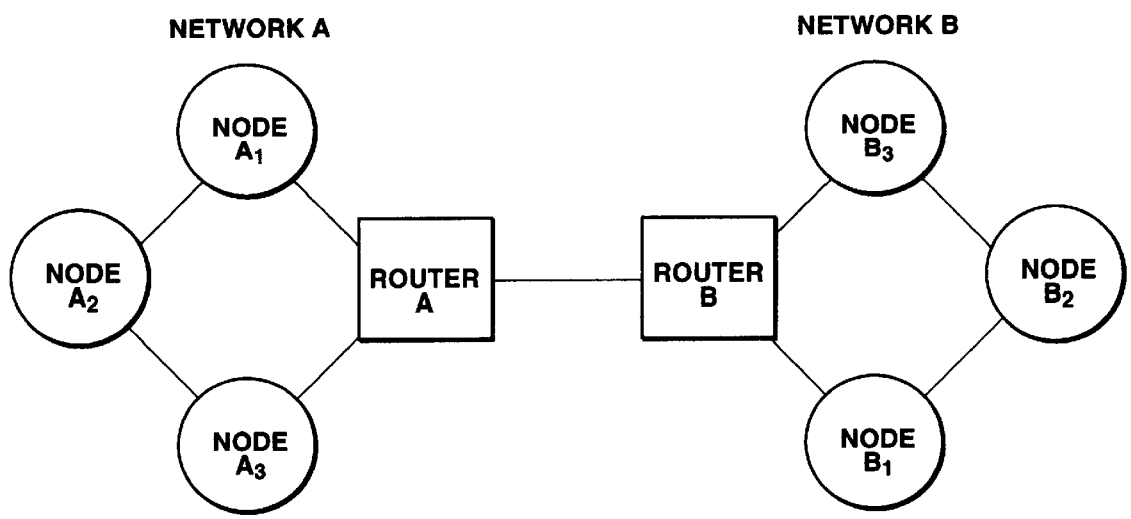
FIG. 10 is a block diagram illustrating the structure of a wavelength division multiplex communication network using an optical wavelength conversion apparatus according to the present invention.

FIG. 10 illustrates a wavelength division multiplex communication network using the optical wavelength conversion apparatus of the present invention. In FIG. 10, each of networks A and B uses common wavelengths of $\lambda_0$, $\lambda_1$, $\lambda_2$ and $\lambda_3$ and performs wavelength multiple communication using a wavelength address method (in which a wavelength is pre-assigned to each node), and the networks A and B are connected to each other by routers A and B each including the optical wavelength conversion appratus.

In a case of the communication from a node A1 to a node B3, for example, the node Al sends a signal at the address wavelength $\lambda_0$ assigned to the router A and the router A converts the wavelength $\lambda_0$ into the wavelength $\lambda_3$ and transmits the converted signal to the network B, thus performing the communication from the node A1 to the node B3. Accordingly, since the optical wavelength conversion apparatus converts the wavelength of the optical signal into another while maintaining the optical signal, the connection between the networks can be readily performed while the same wavelengths are used in each network.

As described in the foregoing, according to a model of the present invention, a semiconductor laser, which has a periodic structure in its waveguide and whose active layer has a nearly equal gain for two independent polarization modes, is used as an optical wavelength conversion component for converting the input wavelength to another output wavelength while maintaining the optical signal, so that the number of components can be lessened and the entire structure can be simplified. Further, the operation speed (modulation speed) or switching time of the apparatus is independent from the injection time of carriers and determined by the recombination speed between electrons and holes, so that the apparatus is operable at high speed.

Furthermore, according to another model of the present invention, input light in a predetermined polarization mode is amplified and the amplified one is input into a semiconductor laser which has a nearly equal gain for two independent polarization modes, so that the polarization can be switched even when the gain of the semiconductor laser is insufficient at the wavelength of the input light. Thus the optical wavelength conversion apparatus can operate in a wide band range. Further, when a wavelength filter is disposed on the input side, any one of multiplexed wavelengths on the transmission line can be converted into a desired wavelength.

Except as otherwise disclosed herein, the various components shown in outline or block form in any of FIGS. 1–10 are individually well known in the optical semiconductor device, and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optical wavelength conversion apparatus comprising:

a polarization switchable semiconductor laser, an oscillation polarization mode of said semiconductor laser being switchable between two independent polarization modes of different wavelengths, depending on a stimulated condition of said semiconductor laser;

first means for selecting a polarization mode for light input to said semiconductor laser from among the two independent polarization modes; and second means for selecting a polarization mode for light emitted from said semiconductor laser from among the two independent polarization modes.

2. An optical wavelength conversion apparatus according to claim 1, said semiconductor laser comprising a semiconductor laser which can oscillate in one of the two independent polarization modes when no light enters said semiconductor laser and can oscillate in another of the two independent polarization modes when light in the another polarization mode is input to said semiconductor laser.

3. An optical wavelength conversion apparatus according to claim 1, said semiconductor laser comprising a semiconductor laser which includes a periodic structure therein and an active layer with a nearly equal gain for the two independent polarization modes.

4. An optical wavelength conversion apparatus according to claim 3, said semiconductor laser comprising one of a multi-electrode distributed feedback semiconductor laser with a plurality of electrodes for supplying electric power thereto and a multi-electrode distributed Bragg reflector semiconductor laser with a plurality of electrodes for supplying electric power thereto.

5. An optical wavelength conversion apparatus according to claim 4, said multi-electrode distributed feedback semiconductor laser including a phase shift region.

6. An optical wavelength conversion apparatus according to claim 3, said semiconductor laser comprising an active layer of a multi-quantum well structure, said active layer being constructed such that the nearly equal gain for the two polarization modes is attained by an increase in a TE-mode gain due to a quantum effect and an increase in a TM-mode gain due to introduction of a tensile strain into the multi-quantum well structure.

7. An optical wavelength conversion apparatus according to claim 3, said active layer of said semiconductor laser with the nearly equal gain for the two polarization modes having a structure in which a compressively-strained quantum well layer and a tensile-strained quantum well layer are layered.

8. An optical wavelength conversion apparatus according to claim 3, said active layer of said semiconductor laser with the nearly equal gain for the two polarization modes having a structure in which a first gain region with a gain dominant for one of the two polarization modes and a second region with a gain dominant for another of the two polarization modes are arranged in a cavity direction of said semiconductor laser.

9. An optical wavelength conversion apparatus according to claim 1, said semiconductor laser comprising a semiconductor laser with at least one electrode whose oscillation polarization mode can be switched from one of the two independent polarization modes to another by controlling a current injected through the electrode.

10. An optical wavelength conversion apparatus according to claim 1, said semiconductor laser comprising a semiconductor laser including at least one electrode whose oscillation wavelength can be changed by controlling a current injected through said electrode.

11. An optical wavelength conversion apparatus according to claim 1, further comprising third means for amplifying the light input to said semiconductor laser.

12. An optical wavelength conversion apparatus according to claim 11, said third means comprising a semiconductor optical amplifier for amplifying the light input to said semiconductor laser.

13. An optical wavelength conversion apparatus according to claim 12, said semiconductor optical amplifier and said semiconductor laser being integrated on a common substrate.

14. An optical wavelength conversion apparatus according to claim 12, said semiconductor optical amplifier and said semiconductor laser respectively including stripe waveguides, and at least one of the facing facets of said semiconductor optical amplifier and said semiconductor laser being inclined to a direction of the stripe waveguide.

15. An optical wavelength conversion apparatus according to claim 1, said first means comprising means for amplifying the light input to said semiconductor laser.

16. An optical wavelength conversion apparatus according to claim 15, said first means comprising a semiconductor optical amplifier for amplifying the light input to said semiconductor laser.

17. An optical wavelength conversion apparatus according to claim 16, said semiconductor optical amplifier comprising an amplifier for selectively amplifying the light in the predetermined polarization mode predominantly.

18. An optical wavelength conversion apparatus according to claim 16, said semiconductor optical amplifier and said semiconductor laser being integrated on a common substrate.

19. An optical wavelength conversion apparatus according to claim 16, said semiconductor optical amplifier and said semiconductor laser respectively including stripe waveguides, and at least one of the facing facets of said semiconductor optical amplifier and said semiconductor laser being inclined to a direction of the stripe waveguide.

20. An optical wavelength conversion apparatus according to claim 1, at least one of said first means and said second means comprising a polarizer properly set to said semiconductor laser.

21. An optical wavelength conversion apparatus according to claim 1, at least one of said first means and said second means comprising a polarization maintaining optical fiber properly set to said semiconductor laser.

22. An optical wavelength conversion apparatus according to claim 1, further comprising a wavelength filter for selecting light at a wavelength from input light containing a plurality of wavelengths.

23. An optical wavelength conversion method comprising the steps of:
   preparing an optical wavelength conversion apparatus, the optical wavelength conversion apparatus including:
      a polarization switchable semiconductor laser, an oscillation polarization mode of said semiconductor laser being switchable between two independent polarization modes of different wavelengths, depending on a stimulated condition of said semiconductor laser;
      first means for selecting a polarization mode of the light input in said inputting step; and
      second means for selecting a polarization mode for light emitted from said semiconductor laser from among the two independent polarization modes;
   inputting light to the optical wavelength conversion apparatus, a component of the light including the polarization mode selected by the first means; and
   producing light emitted from the second means of the optical wavelength conversion apparatus having the polarization mode selected by the second means of the optical wavelength conversion apparatus.

24. A wavelength division multiplex communication network comprising:
   a transmission line for transmitting an optical signal from a transmitter side to a receiver side; and
   an optical wavelength conversion apparatus used as an optical converter for converting a wavelength of the optical signal into another wavelength as the optical signal is maintained, said optical wavelength conversion apparatus including:
      a polarization switchable semiconductor laser, an oscillation polarization mode of said semiconductor laser being switchable between two independent polarization modes of different wavelengths, depending on a stimulated condition of said semiconductor laser;
      first means for selecting a polarization mode for light input to said semiconductor laser from among the two independent polarization modes; and
      second means for selecting a polarization mode for light emitted from said semiconductor laser from among the two independent polarization modes.

25. An optical wavelength conversion apparatus comprising:
   a polarization switchable semiconductor laser, an oscillation polarization mode of said semiconductor laser being switchable between two independent polarization modes of different wavelengths, depending on a stimulated condition of said semiconductor laser;
   a first polarization control device selecting a polarization mode of light input to said semiconductor laser from among the two independent polarization modes; and a second polarization control device selecting a polarization mode for light emitted from said semiconductor laser from among the two independent polarization modes.

26. An optical wavelength conversion apparatus comprising:
   a polarization switchable semiconductor laser, an oscillation polarization mode of said semiconductor laser being switchable between two independent polarization modes of different wavelengths, depending on a stimulated condition of said semiconductor laser;
   a first polarization selecting device selecting a polarization mode of light input to said semiconductor laser from among the two independent polarization modes; and
   a second polarization selecting device selecting a polarization mode for light emitted from said semiconductor laser from among the two independent polarization modes.

27. A wavelength division multiplex communication network comprising:
   a transmission line for transmitting an optical signal from a transmitter side to a receiver side; and
   an optical wavelength conversion apparatus used as an optical converter for converting a wavelength of the optical signal into another wavelength as the optical signal is maintained, said optical wavelength conversion apparatus including:
      a polarization switchable semiconductor laser, an oscillation polarization mode of said semiconductor laser being switchable between two independent polarization modes of different wavelengths, depending on a stimulated condition of said semiconductor laser;
      a first polarization control device selecting a polarization mode for light input to said semiconductor laser from among the two independent polarization modes; and
      a second polarization control device selecting a polarization mode for light emitted from said semiconductor laser from among the two independent polarization modes.

28. A wavelength division multiplex communication network comprising:
   a transmission line for transmitting an optical signal from a transmitter side to a receiver side; and
   an optical wavelength conversion apparatus used as an optical converter for converting a wavelength of the optical signal into another wavelength as the optical signal is maintained, said optical wavelength conversion apparatus including:
      a polarization switchable semiconductor laser, an oscillation polarization mode of said semiconductor laser being switchable between two independent polarization modes of different wavelengths, depending on a stimulated condition of said semiconductor laser;
      a first polarization selecting device selecting a polarization mode for light input to said semiconductor laser from among the two independent polarization modes; and
      a second polarization selecting device selecting a polarization mode for light emitted from said semiconductor laser from among the two independent polarization modes.

* * * * *

UNITED STATES PATENT AND TRADEMARK OFFICE
CERTIFICATE OF CORRECTION

PATENT NO.   : 6,195,188 B1
DATED        : February 27, 2001
INVENTOR(S)  : Yoshinobu Sekiguchi It is certified that error appears in the above-identified patent and that said Letters Patent is hereby corrected as shown below:

Column 3,
Line 8, "overs" should read -- goes over --; and
Line 55, "to" should be deleted.

Column 5,
Line 64, "an" should read -- a --.

Column 9,
Line 52, "appratus." should read -- apparatus. --.

Signed and Sealed this

Fifth Day of March, 2002

Attest:

JAMES E. ROGAN
Attesting Officer   Director of the United States Patent and Trademark Office